United States Patent [19]
Crouch et al.

[11] Patent Number: 5,355,021
[45] Date of Patent: Oct. 11, 1994

[54] OHMIC CONTACT FOR P-TYPE GAAS

[75] Inventors: Mark A. Crouch, Worcester; Suhkdev S. Gill, Midlands; William H. Gilbey; Graham J. Pryce, both of Worcester, all of United Kingdom

[73] Assignee: The Secretary of State for Defence in Her Britannic Majesty's Government of the United Kingdom of Great Britain and Northern Ireland, Hants, England

[21] Appl. No.: 75,460

[22] PCT Filed: Jul. 18, 1991

[86] PCT No.: PCT/GB91/01198

§ 371 Date: Jun. 11, 1993

§ 102(e) Date: Jun. 11, 1993

[87] PCT Pub. No.: WO92/02037

PCT Pub. Date: Feb. 6, 1992

[30] Foreign Application Priority Data

Jul. 19, 1990 [GB] United Kingdom ............... 9015871

[51] Int. Cl.$^5$ ............... H01L 29/46; H01L 21/285; H01L 23/485
[52] U.S. Cl. ............... 257/745; 257/744; 257/751
[58] Field of Search ............ 257/741, 744, 745, 750, 257/751, 768, 769

[56] References Cited

U.S. PATENT DOCUMENTS 4,395,727 7/1983 Lauterbach ............... 357/71

OTHER PUBLICATIONS

Journal of Electronic Materials, vol. 19, No. 3, 1990, Bruce et al, "Low Resistant Pd/Zn/PdAu Ohmic Contacts of P-Type GaAs", pp. 225-229.
Materials Letters, vol. 8, No. 10, Oct. 1989, Ivey et al: "Expitaxially Grown PdzInP on InP" pp. 389-395.
Journal of Applied Physics, vol. 59, No. 10, May 1986, Kobayashi et al "An Atomistic Study Of The GaAs-Pd Interface"pp. 3448-3453.
Journal of Electronic Materials, vol. 20, No. 3, 1991, Ivey et al "Pd/Zn/Pd/Au Ohmic Contacts to P-Type GaAs" pp. 237-246.

*Primary Examiner*—Rolf Hille
*Assistant Examiner*—Peter Toby Brown
*Attorney, Agent, or Firm*—Nixon & Vanderhye

[57] ABSTRACT

A low resistance contact for p-type GaAs is provided by Pd/Zn/Pd/Au structure 1. The contact is suitable for device substrates having carrier concentrations in the range of about $10^{18}$ to about $10^{20}$ cm$^{-3}$. The ohmic contact has a Pd layer of depth 3 nm to 15 nm, a Zn layer with a depth of between 5 nm and 40 nm, a second Pd layer with a depth greater than about 50 nm and an Au layer with a depth greater than about 300 nm. A preferred construction (1) is 5 nm/10 nm/100 nm/400 nm of Pd/Zn/Pd/Au. The ohmic contact deposition must be followed by annealing, with preferred annealing carried out at a temperature of about 200° C. Annealing times are dependent upon annealing temperature, with a typical minimum annealing times of greater than 5 minutes at annealing temperatures of about 200° C.

11 Claims, 5 Drawing Sheets

OHMIC CONTACT FOR P-TYPE GAAS

BACKGROUND OF THE INVENTION

1. Field of the Invention

This invention relates to ohmic contacts for p-type GaAs devices.

2. Discussion of the Prior Art

GaAs is a preferred material for manufacture of high speed devices such as bipolar transistors, heterojunction bipolar transistors, and p-i-n diodes. P-type GaAs and GaAlAs are often used as thin layers in multilayer devices. This means that in addition to requiring low contact resistance, in order to maximise efficient use of the higher operating speeds possible for devices made of such materials, it is also preferable to keep contact alloying heat treatment temperatures low so that inter-layer and intra-layer diffusion is minimised.

R C Brooks et al (IEEE Elect. Dev. Lett. Vol. EDL-6(10) p525 1985) detail typical specific contact resistance values of ohmic contacts for p-type GaAs using a Zn/Pd/Au metallisation. However, although specific contact resistances as low as $7 \times 10^{-7} \Omega.cm^2$ were achieved in material with $2 \times 10^{19}$ cm$^{-3}$ doping, the heat treatment temperatures needed for these values were in the range of about 420° C.–490° C.

In 1989 Yicheng Lu et al (J. Electrochem. Soc., Vol. 136, (10), p3123, 1989) used p-type GaAs ($3 \times 10^{17}$ cm$^{-3}$) and Au/Zn/Au contacts to achieve specific contact resistivity of $3.3 \times 10^{-6} \Omega.cm^2$. This value does not at first appear to be as good as that given by Brooks et al (Supra). However, it must be noted that these contacts are made on much lower doped material. As a general rule, the higher the material doping then the lower the value of contact resistance. Also, the specific contact resistivity of $3.3 \times 10^{-6} \Omega.cm^2$ is corrected for sheet resistance, whereas no correction was given by Brooks et al. With no correction, then the specific contact resistance is better than the values obtained by Brooks et al.

In order to achieve the optimum contact resistivity Yicheng Lu used a two stage heat treatment process of preheating at 350° C. for 15 seconds followed by a rapid thermal anneal at 450° C. for 5 seconds.

Alternatively, C Dubon-Chevalier et al (J. Appl. Phys. 59(11), p3783, 1986) used AuMn as ohmic contacts. In the doping range of $10^{18}$ to $10^{19}$ cm$^{-3}$ the specific contact resistivities varied between $10^{-5}$ and $2 \times 10^{-7} \Omega.cm^2$ respectively. The contacts had all undergone contact alloying heat treatments at 450° C.

Most recently R Bruce et al. (J of Electr Mats 19 (3) p225 1990) reported a low resistance Pd/Zn/Pd/Au ohmic contact for p-type GaAs. The contacts were formed by the sequential electron-beam evaporation of 10 nm Pd, <5 nm Zn, 20 nm Pd and 40 nm Au layers on GaAs with a doping level of $5 \times 10^{18}$ cm$^{-3}$. Minimum contact resistance of 0.04 $\Omega.mm$ (contact resistivity of $<1 \times 10^{-7} \Omega.cm^2$) was obtained from such Pd/Zn/Pd/Au contacts which had been annealed at 500° C. for 30 seconds.

SUMMARY OF THE INVENTION

It is the object of this invention to provide a low contact resistance ohmic contact for p-type GaAs which may be made using low contact alloying heat treatment temperatures.

According to this invention an ohmic contact for p-type GaAs comprises:

a Pd/Zn/Pd/Au ohmic contact
characterised in that
the ohmic contact has a construction of a first layer of Pd with a depth of between 3 nm and 15 nm, a Zn layer with a depth of between 5 nm and 40 nm, a second Pd layer with a depth of greater than about 50 nm and a Au layer with a depth of greater than about 300 nm.

Preferably the second palladium (Pd) layer has a depth of between about 50 nm and about 200 nm. It is thought that the second Pd layer provides a gold (Au) diffusion barrier.

The Au layer is thought to provide a ceiling layer, and thus is not expected to have any maximum depth. Such a ceiling layer has a minimum depth of about 300 nm. Practical maximum depths of the Au layer are normally dictated by constraints of material cost and production cost, with a maximum Au layer depth of 600 nm being a typical expected maximum.

The preferred layer construction has a first palladium (Pd) layer depth of between about 5 nm and about 10 nm and a zinc (Zn) layer depth of about 10 nm. The most preferred layer construction is 5 nm/10 nm/100 nm/400 nm of Pd/Zn/Pd/Au.

Typical carrier concentrations of GaAs suitable for a Pd/Zn/Pd/Au ohmic contact are in the range of about $10^{18}$ to $10^{20}$ cm$^{-3}$.

Following deposition of the contact metals it is necessary to anneal the contact. This process is used to alloy the deposited metals into the GaAs in order to achieve the required ohmic behaviour and a low contact/GaAs contact resistance. Typical annealing temperatures are between about 150° C. and about 390° C. The preferred annealing temperature is about 200° C.

Typical annealing methods include graphite strip heaters and hotplates. Preferably graphite strip heaters are used for annealing temperatures greater than about 250° C. Where graphite strip heaters are used, then the GaAs and ohmic contact are heated up to about the required annealing temperature and then cooling takes place immediately, i.e. a zero anneal hold time. At annealing temperatures below 250° C. the preferred annealing method is that of placing the contact bearing material (e.g. a substrate bearing many devices) on a pre-heated hotplate. Typically, the minimum length of time of annealing on a pre-heated hotplate is 5 minutes, dependent upon the hotplate temperature. The preferred annealing program is that of heating the hotplate to 200° C. and annealing for 15 minutes.

Suitable method of producing the ohmic contacts include thermal evaporation, electron beam evaporation and sputter coating.

The purity of the contact metals prior to use is typically about 99.999%.

The preferred deposition rates are about 0.5 to 0.6 nm s$^{-1}$ for the first Pd layer, about 0.4 to 0.5 nm s$^{-1}$ for the Zn layer, and about 1 nm s$^{-1}$ for each of the second Pd layer and the gold (Au) layer.

BRIEF DESCRIPTION OF THE DRAWINGS

The invention will now be further described by example only with reference to the following figures.

DETAILED DISCUSSION OF THE PREFERRED EMBODIMENT

Figure 1:
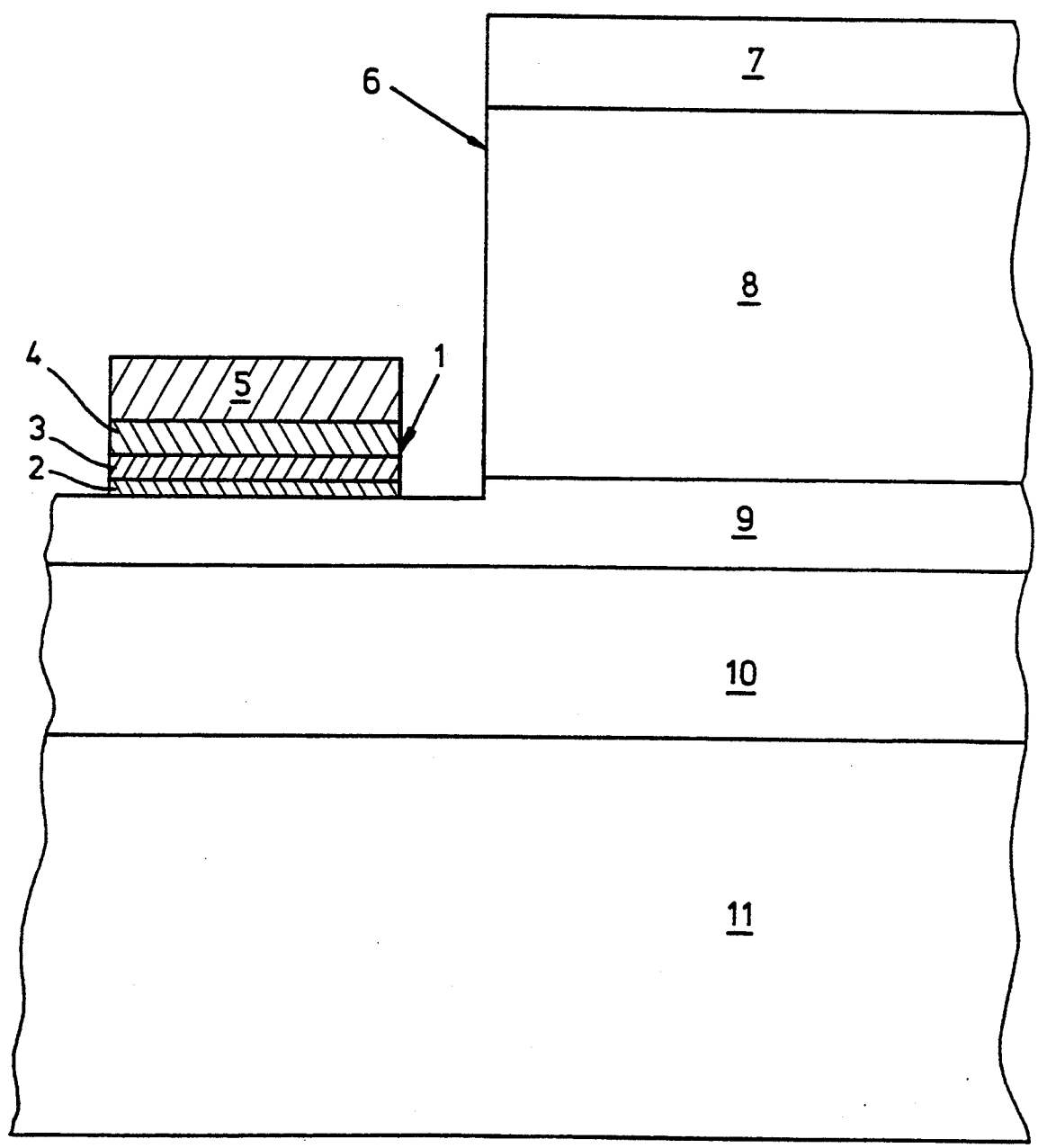
FIG. 1 shows in cross-section a preferred ohmic contact construction within a typical device structure requiring such an ohmic contact.

A cross-section of the preferred construction of ohmic contact 1 can be seen in FIG. 1. The ohmic contact comprises a first palladium (Pd) layer 2 of 5 nm depth, a zinc (Zn) layer 3 of 10 nm depth; a second Pd layer 4 of 100 nm depth and a gold (Au) layer 5 of 400 nm depth. Device wafer 6 is made up of an n-type GaAs layer 7, an n-type GaAlAs layer 8, a thin p-type GaAs layer 9, an n-type GaAs layer 10 and a semiconducting n-type GaAs substrate 11. This type of layer structure would be suitable for devices. It can be seen that removal of part of layers 7 and 8 (e.g. by etching) provides access for location of ohmic contact 1 in the thin p-type GaAs layer 9. The ohmic contact layers were all deposited by thermal evaporation.

Prior to ohmic contact pattern definition, all exposed areas of the device layer structure are cleaned with a solvent spray for 60 seconds, suitable cleaning solvents being acetone or isopropyl alcohol. After cleaning, the definition of areas onto which the ohmic contacts are to be deposited, i.e. within accessed regions to layer 8, is carried out. This definition is often carried by a process such as lithography.

The first step in the ohmic contact process is the deoxidation of exposed surfaces of device wafer 6. This may be carried out in a bath of 10% $NH_4$ in deionised water for approximately 30 seconds. The device wafer is then dried, most conveniently by blowing nitrogen gas over the substrate, and transferred onto a jig. The jig is placed in a thermal evaporator such as that which may be seen schematically in FIG. 2. The drying and transfer of the device wafer into the evaporator is carried out as quickly as possible in order to minimise the reoxidation of the exposed surfaces in the free environment.

Figure 2:
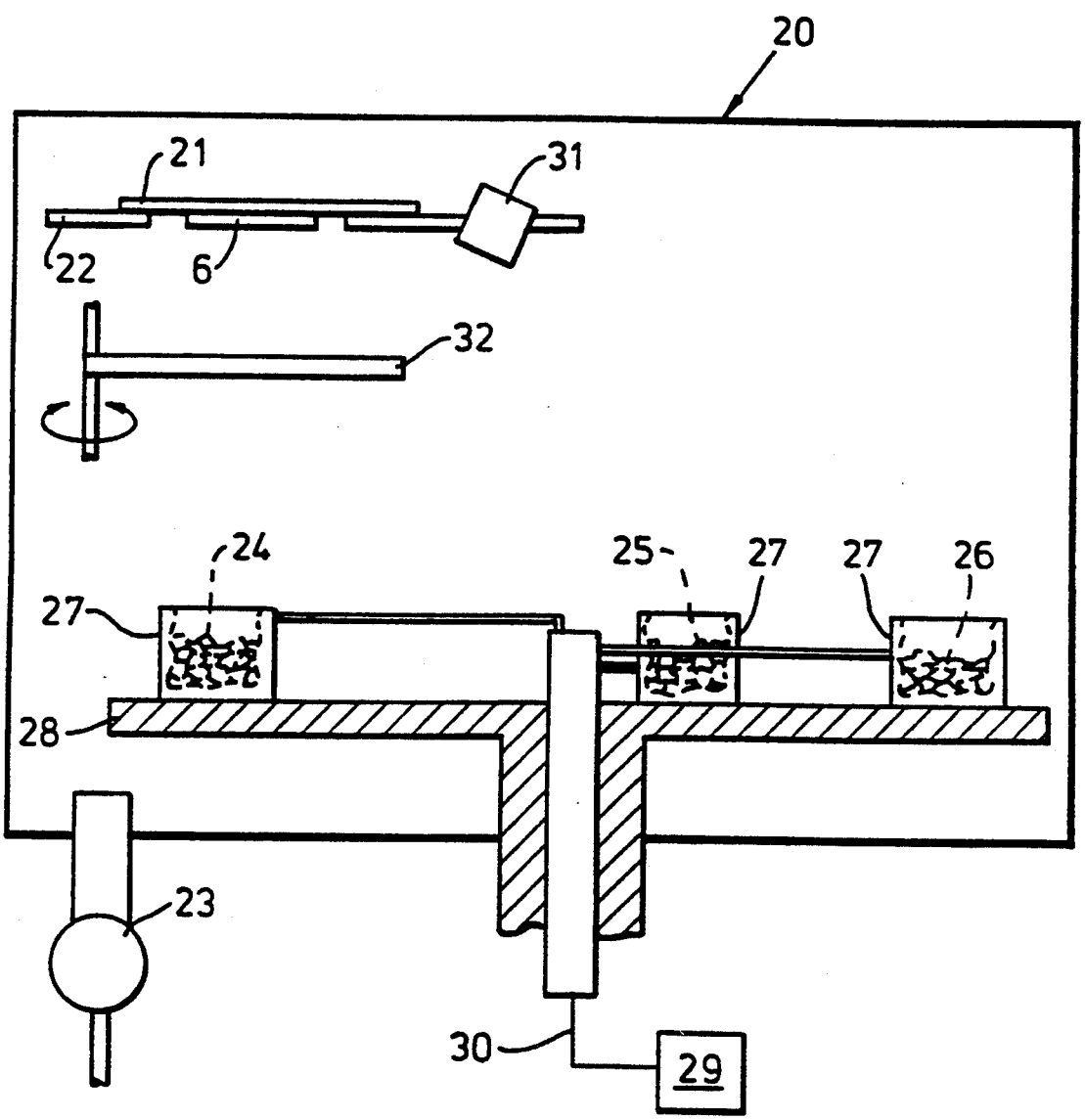
FIG. 2 is a schematic representation of thermal evaporation apparatus used to deposit the ohmic contact metals.

FIG. 2 is a schematic representation of a thermal evaporator 20 which may be used to deposit palladium, zinc and gold layers on the device wafer 6. Jig 21, which is carrying the device wafer, is placed in a holder 22. The evaporator is pumped down by pump 23 to a vacuum of $10^{-6}$ Torr or better. Slugs of palladium 24, zinc 25 and gold 26 are each held in vitreous graphite crucibles 27 which are an integral Part of carousel 28. Heating of the crucibles is provided from an external power source 29 by electrical 30 to resistive heaters within the crucibles.

The carousel is rotated to position the palladium bearing crucible approximately below the device wafer 6. The carousel is raised to bring the crucible nearer to the device wafer, and then the crucible is heated sufficiently to make the palladium slugs 24 become molten. Monitoring of the deposition rate and thickness of deposited material is carried out by the use of crystal monitor 31. The device wafer 6 is protected from the evaporated material by shutter 32. When the deposition rate is sufficiently high (typically about 0.5 to 0.6 nm $s^{-1}$), the shutter is rotated away to reveal the patterned surface to the evaporated material. The thickness of the deposited material is monitored by the crystal monitor, with the shutter rotated back to shield the device wafer 6 when 5 nm of palladium has been deposited. The heating of the palladium crucible is then stopped and the carousel lowered to rotate the zinc bearing crucible under the device wafer. The evaporation process is then repeated to deposit about 10 nm of zinc at about 0.4 to 0.5 nm $s^{-1}$. The same steps are also followed for evaporation of a 100 nm palladium layer and a 400 nm gold layer, both at a rate of about 1 nm $s^{-1}$.

Figure 3:
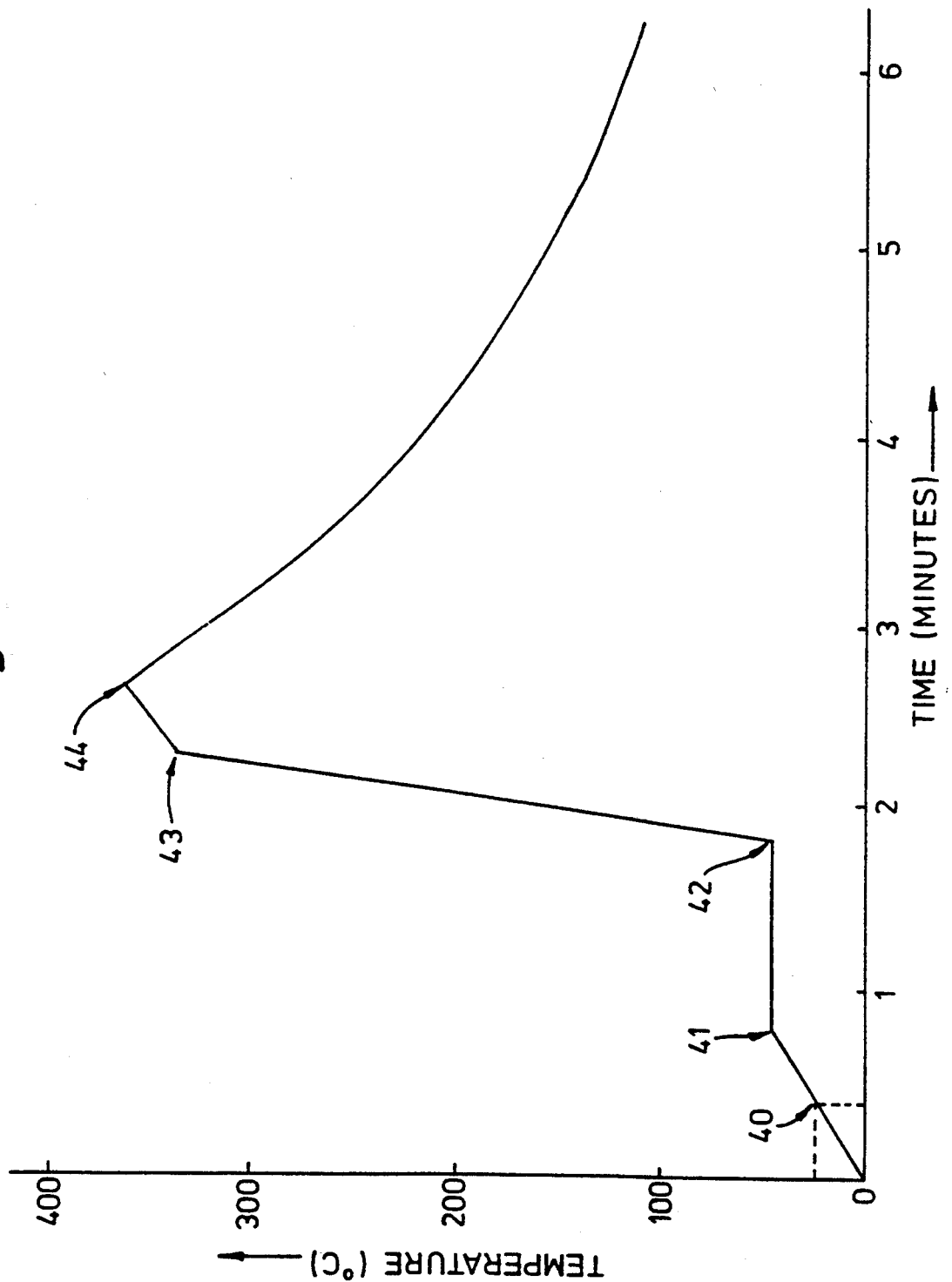
FIG. 3 is a graph of a typical temperature profile of heating and cooling a graphite strip heater.

Following deposition of the Pd/Zn/Pd/Au to form an ohmic contact, the required ohmic behaviour and low contact-device material resistance is achieved by annealing to alloy the deposited metals into the p-type GaAs. Annealing may take place by graphite strip heater, typically for annealing temperatures of between about 250° C. and about 390° C. A typical annealing profile for a 360° C. anneal can be seen in FIG. 3.

The temperature is measured by probing thermocouple on the upper surface of the device substrate 6. At room temperature, point 40, the device wafer is heated at a rate of 60° C./minute to a temperature of 50° C., point 41. It is held at this temperature for 1 minute and then heated, point 42, at a rate of 600° C./minute until a temperature of 340° C. is reached, point 43. The device wafer 6 is then heated to 360° C., Point 44, at a rate of 60° C./minute. The heating is then turned off and natural cooling occurs. Point 43 is usually about 20° C. below the peak annealing temperature of Point 44 in order that the slower rate of heating can then be applied and greater control of the device wafer temperature be maintained.

However, it has been found that superior contact resistances and specific contact resistivities have been achieved by use of lower annealing temperatures. The device wafer 6 is taken out of the jig 21 and placed, with the device surface uppermost, on a pre-heated hotplate. Typical hotplate temperatures are between about 150° C. to about 250° C. Annealing times vary according to the annealing temperature used, with typical annealing times greater than about 5 minutes. The preferred annealing conditions are a 15 minute anneal on a 200° C. hotplate.

Contact quality is assessed on contacts with variable transmission gap structures which are fabricated on the device wafer. By using a computer controlled autoprobing facility all such structures across a device wafer may be measured for both contact resistance and specific contact resistivity.

Figure 4:
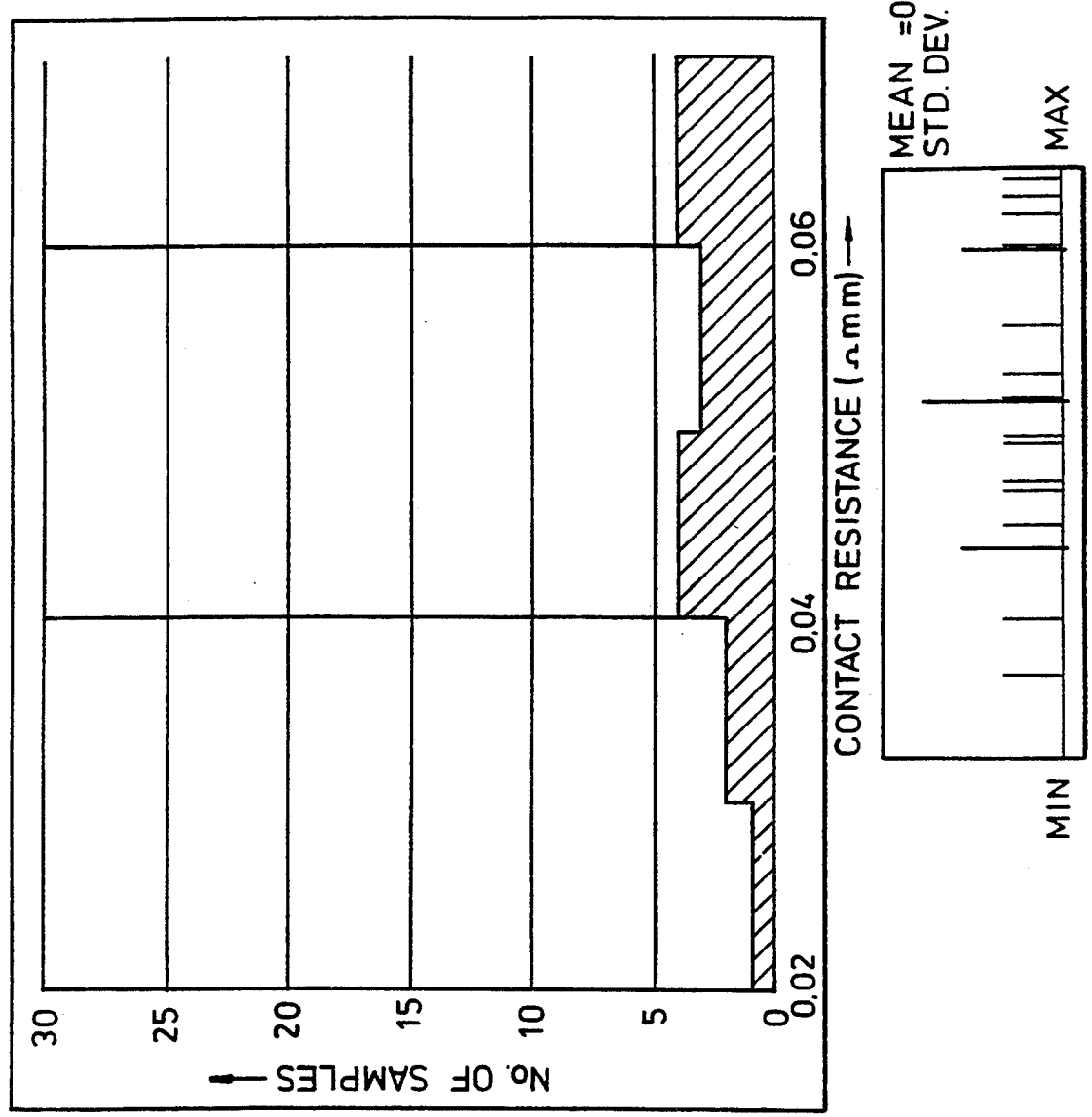
FIG. 4 is a histogram of a typical spread of contact resistance values for an ohmic contact of the construction shown in FIG. 1.

FIG. 4 is a histogram showing typical distribution of contact resistance (Ω-mm) of ohmic contacts of the preferred layer structure on p-type GaAs material of $5 \times 10^{18}$ $cm^{-3}$ doping level. The contacts were manufactured using the processing steps described above. The mean contact resistance is 0.05041 Ω-mm with a standard deviation of 0.0127 Ω-mm. The ohmic contracts had undergone annealing for 15 minutes on a hotplate at a temperature of 200° C.

Figure 5:
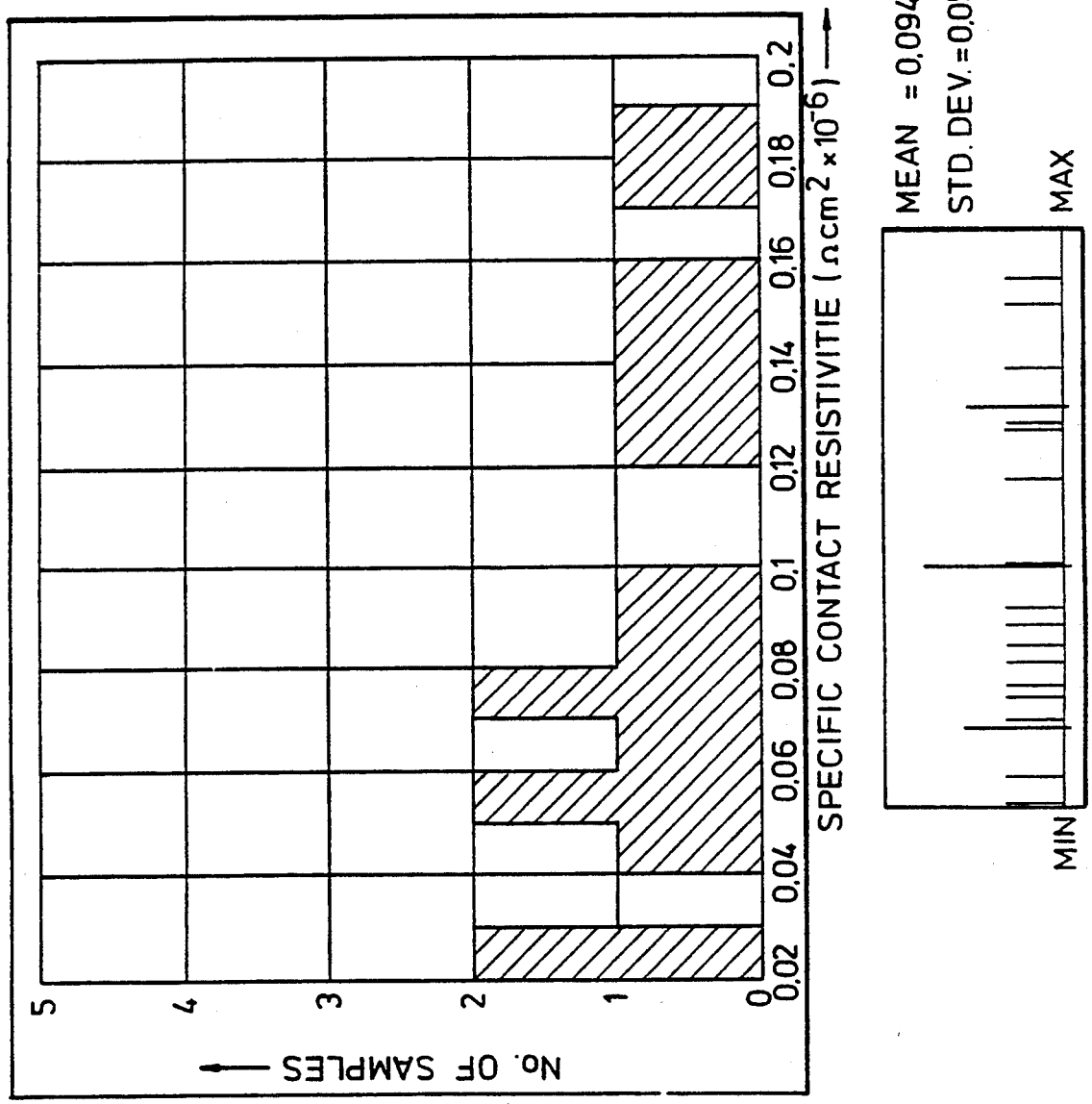
FIG. 5 is a histogram of a typical spread of specific contact resistivity values on the same ohmic contact as that measured for FIG. 4.

FIG. 5 is a histogram showing typical distribution of specific contact resistivity (Ω.$cm^2$) of ohmic contacts of the preferred layer structure on typical p-type GaAs material. The contacts were manufactured using the processing steps described above followed by annealing for 15 minutes on a hotplate at a temperature of 200° C. The mean specific contact resistivity is $0.09489 \times 10^{-6}$ $\Omega\text{cm}^2$ with a standard deviation of $0.05037 \times 10^{-6}$ $\Omega\text{cm}^2$

We claim:

1. An ohmic contact for p-type GaAs comprising:
   a Pd/Zn/Pd/Au ohmic contact
   characterised in that
   the ohmic contact has a construction of a first layer of Pd with a depth of between 3 nm and 15 nm, a Zn layer with a depth of between 5 nm and 40 nm, a second Pd layer with a depth of greater than about 50 nm and a Au layer with a depth of greater than about 300 nm.

2. An ohmic contact as claimed in claim 1 where the first palladium layer has a depth of between about 5 nm and about 10 nm.

3. An ohmic contact as claimed in claim 1 where the first palladium layer has a depth of about 5 nm.

4. An ohmic contact as claimed in claim 1 where the zinc layer has a depth of about 10 nm.

5. An ohmic contact as claimed in claim 1 where the second palladium layer has a depth of about 100 nm.

6. An ohmic contact as claimed in claim 1 where the gold layer has a depth of about 400 nm.

7. An ohmic contact as claimed in claim 1 where the multiple layer structure has respective depths of 5 nm/10 nm/100 nm/400 nm.

8. An ohmic contact as claimed in claim 1 annealed at a temperature of between about 150° C. and about 390° C.

9. An ohmic contact as claimed in claim 8 annealed at 200° C.

10. An ohmic contact as claimed in claim 8 annealed for a minimum of 5 minutes.

11. An ohmic contact as claimed in claim 9 annealed for 15 minutes.

* * * * *